United States Patent
Mei et al.

(10) Patent No.: US 10,854,819 B2
(45) Date of Patent: *Dec. 1, 2020

(54) METHODS AND COMPOSITIONS FOR ENHANCING PROCESSABILITY AND CHARGE TRANSPORT OF POLYMER SEMICONDUCTORS (71) Applicant: Purdue Research Foundation, West Lafayette, IN (US)

(72) Inventors: Jianguo Mei, West Lafayette, IN (US); Yan Zhao, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/165,938

(22) Filed: Oct. 19, 2018

(65) Prior Publication Data

US 2019/0058126 A1 Feb. 21, 2019

Related U.S. Application Data (63) Continuation of application No. 15/164,453, filed on May 25, 2016, now Pat. No. 10,109,798.

(60) Provisional application No. 62/166,206, filed on May 26, 2015.

(51) Int. Cl.
*H01L 51/00* (2006.01)
*H01L 51/05* (2006.01)

(52) U.S. Cl.
CPC ...... *H01L 51/0036* (2013.01); *H01L 51/0558* (2013.01); *H01L 51/0575* (2013.01)

(58) Field of Classification Search
CPC ............. H01L 51/0036; H01L 51/0558; H01L 51/0575
USPC .......................................................... 257/40
See application file for complete search history.

(56) References Cited

PUBLICATIONS

Huajie Chen et al. (Adv. Mater. 2012, 24, 4618-4622) (Year: 2012).*
Yan Zhao et al. (Chem. Mater. 2015, 27, 7164-7170) (Year: 2015).*

* cited by examiner

*Primary Examiner* — Dzung Tran
(74) *Attorney, Agent, or Firm* — Purdue Research Foundation

(57) ABSTRACT

A method of making a solid state semiconducting film. The method includes blending a non-conjugated semiconducting polymer matrix containing crystalline aggregates with intentionally placed conjugation-break spacers along the polymer backbone, and fully conjugated semiconducting polymer. The resulting blend is subjected to a film making method to result is a semiconducting film. A solid state semiconducting film comprising a non-conjugated semiconducting polymer matrix containing crystalline aggregates with intentionally placed conjugation-break spacers along the polymer backbone, and a fully conjugated semiconducting polymer, wherein the fully conjugated semiconducting polymer serves as tie chains to bridge crystalline aggregates from the non-conjugated polymer matrix. Devices made from these semiconductor films.

4 Claims, 9 Drawing Sheets

DPP-C3

FIG. 1A

DPP-C0

METHODS AND COMPOSITIONS FOR ENHANCING PROCESSABILITY AND CHARGE TRANSPORT OF POLYMER SEMICONDUCTORS

CROSS-REFERENCE TO RELATED APPLICATIONS

The present U.S. patent application is a continuation of U.S. patent application Ser. No. 15/164,453 filed May 25, 2016, which is related to and claims the priority benefit of U.S. Provisional Patent Application Ser. No. 62/166,206, filed May 26, 2015; the contents of both these applications are hereby incorporated by reference in their entirety into the present disclosure.

TECHNICAL FIELD

This disclosure relates to methods and compositions for enhancing processability and charge transport of polymer semiconductors.

BACKGROUND

This section introduces aspects that may help facilitate a better understanding of the disclosure. Accordingly, these statements are to be read in this light and are not to be understood as admissions about what is or is not prior art.

Semiconducting polymers have been under extensive investigation due to their technological relevance in a wide range of applications from solar cells, light-emitting diodes, and transistors to various sensing platforms, among others. The capability of transporting charge carriers is one of the fundamental properties of semiconducting polymers. Efficient charge transport is strongly desired for such polymer-based thin-film devices, particularly for field-effect transistors and organic circuits. To date, a great number of conjugated polymers have been reported with charge carrier mobilities over $1$ cm$^2$ V$^{-1}$ s$^{-1}$ in both p-type and n-type transistors. A handful of donor-acceptor-type polymers have even shown hole mobility values exceeding $10$ cm$^2$ V$^{-1}$ s$^{-1}$. These inspiring and puzzling breakthroughs have far exceeded the charge transport limits for disordered polymers based on early theoretical models, mostly adapted from the study of inorganic semiconductors.

The discrepancy between experimental results and theoretical predictions has triggered a great deal of efforts to propose new theories to explain the efficient charge transport behaviors in polymer thin films. For examples, by studying an indacenodithiophene-benzothiadiazole copolymer, it has been argued in literature that charge transport in high-mobility semiconducting polymers is quasi one-dimensional, predominantly occurring along the backbone. This requires only occasional intermolecular hopping through short π-stacking bridges. Based on studies with the same polymer, researchers concluded that a planar, torsion-free polymer backbone with a low degree of energetic disorder is the origin for high charge carrier mobilities in donor-acceptor copolymers. Some researchers proposed a unified model of how charge carriers travel in conjugated polymer films from the study of a vast number of existing polymers. They argued that the limiting charge transport step is trapping caused by lattice disorder, and that short-range intermolecular aggregation is sufficient for efficient long-range charge transport. Hence, the unifying requirement for high carrier mobility is the presence of interconnected aggregates. These studies and others provide new insights into charge transport in polymeric thin films. However, a comprehensive understanding of transport in polymeric thin films is still lacking, and there is a need for enhancing these materials for the next generation of flexible and printed electronic device applications.

Conjugated polymers are promising optoelectronic materials for next-generation flexible and printed electronics. Conjugated polymers are a class of polymers with delocalized π-orbitals along the polymer backbone. Extensive efforts have been put into the design and synthesis of conjugated polymers. A plethora of knowledge about how to rationally control their optical, electronic, and redox properties has been realized in the development of numerous conjugated polymers. In contrast, partially-conjugated semiconducting polymers with intentionally-placed, non-conjugated flexible linkages along the polymer backbones have received little attention. There are two primary reasons. First, flexible linkages create high degrees of conformational and energetic disorder in polymer chains. Second, conjugation-break spacers (CBSs) disrupt the extended π-electron delocalization along polymer backbones. Conjugation-break spacers, also called non-conjugated spacers or noπ-conjugation spacers or non-conjugal spacers, are chemical groups that do not present pi-conjugation along the polymer backbone and connect two conjugated moieties through covalent bonds. In principle, both factors can have a negative influence on electronic properties, particularly for charge transport. On the other hand, high performance conjugated polymers are often plagued with poor solution-processability, a leading factor for batch-to-batch variations in both polymer synthesis and device fabrication. This limits applications of conjugated polymers in large scale flexible electronics. Conventionally, tuning solution-processability of polymers in organic solvents can be achieved by changing the size and shape of flexible solubilizing chains attached to polymer backbones. However, the modulation of polymer solution-processability and electronic performance turns out to be nontrivial. It should be noted that solution-processability is a term used to describe the desirable characteristics of the solution, namely adequate solubility of the polymer in this solvent, ability to make the solution as homogeneous as possible in terms the polymer concentration, and the ability of the solution to lend itself to depositing methods that provide uniform thickness and physical properties for films made from the solution.

Currently chlorinated solvents are utilized as solvents for polymer semiconductor materials for solution processing. These solvents are toxic. Further, the existing polymer semiconductors do not lend themselves to melt-processing. Further, the existing polymer semiconductors do not lend themselves extrusion and lamination processing.

For the forgoing reasons, there exists a need for approaches that can be applied to conjugated polymers to enhance their solution-processability as well as lending other types of processability for the conjugated polymers making them into useful polymer semiconductors for electronic and optoelectronic applications. Further, there is need for melt process able polymers and polymers that lens themselves to extrusion and lamination processing.

SUMMARY

A method of making a solid state semiconducting films is disclosed. The method includes providing a non-conjugated semiconducting polymer matrix containing crystalline aggregates with intentionally placed conjugation-break spacers along the polymer backbone, providing a fully conjugated semiconducting polymer; and blending the fully conjugated semiconducting polymer into the non-conjugated semiconducting polymer matrix, wherein the fully conjugated polymer serves as tie chains to bridge crystalline aggregates of the non-conjugated polymer matrix resulting in a solid state semiconducting film. The semiconductor polymer blend is then subjected to a film-making method based on solution processing or melt-processing to form a semiconducting film.

A solid state semiconducting film is disclosed. The film includes a non-conjugated semiconducting polymer matrix containing crystalline aggregates with intentionally placed conjugation-break spacers along the polymer backbone; and a fully conjugated semiconducting polymer, wherein the fully conjugated semiconducting polymer serves as tie chains to bridge crystalline aggregates from the non-conjugated polymer matrix.

A device comprising a solid state semiconducting film is disclosed. The film includes a non-conjugated semiconducting polymer matrix containing crystalline aggregates with intentionally placed conjugation-break spacers along the polymer backbone; and a fully conjugated semiconducting polymer, wherein the fully conjugated semiconducting polymer serves as tie chains to bridge crystalline aggregates from the non-conjugated polymer matrix.

BRIEF DESCRIPTION OF DRAWINGS

Some of the figures shown herein may include dimensions. Further, some of the figures shown herein may have been created from scaled drawings or from photographs that are scalable. It is understood that such dimensions or the relative scaling within a figure are by way of example, and not to be construed as limiting.

DETAILED DESCRIPTION

For the purposes of promoting an understanding of the principles of the disclosure, reference will now be made to the embodiments illustrated in the drawings and specific language will be used to describe the same. It will nevertheless be understood that no limitation of the scope of the disclosure is thereby intended, such alterations and further modifications in the illustrated device, and such further applications of the principles of the disclosure as illustrated therein being contemplated as would normally occur to one skilled in the art to which the disclosure relates.

In this disclosure, a distinct approach to reveal the nature of the connections between π-aggregates is presented. It is recognized that charge transport in polymer thin films is comprised of a complex series of events, which involve multiple electronic processes at different length scales. The contributions to charge transport arising from intrachain and interchain interactions contribute simultaneously to the charge mobility, and even approximately disentangling the individual contributions is challenging. To deepen the understanding of this interplay, the approach of this disclosure includes the study of charge transport behaviors of a semiconducting polymer with intentionally-placed conjugation-break spacers along the polymer backbones, thus eliminating intrachain transport. Various amounts of a structurally-similar, fully-conjugated polymer are then introduced as the tie chain polymer into the polymer matrix with conjugation-break spacers. Results of this technique showed that the addition of as low as 1 wt % tie chain polymer into the polymer matrix leads to a nearly two orders of magnitude improvement in the charge carrier mobility from ~0.015 to 1.14 $cm^2$ $V^{-1}$ $s^{-1}$, accompanied by substantial lowering of activation energy from 100.1 meV to 64.6 meV. The more tie chain polymer is added, the higher the mobility of the blend.

Diketopyrrolopyrrole (DPP)-based semiconducting polymers have been extensively investigated for their charge transport properties. In this study, we choose diketopyrrolopyrrole-quaterthiophene copolymer as an example in demonstrating several features of this disclosure. In this disclosure, complementary semiconducting polymer blends (c-SPBs) for OFETs (Organic Field-Effect Transistors) are disclosed.

In experiments leading to this disclosure, two versions of DPP-based semiconducting polymers, namely two model polymers DPP-C3 and DPP-C0 were investigated.

Figure 1A:
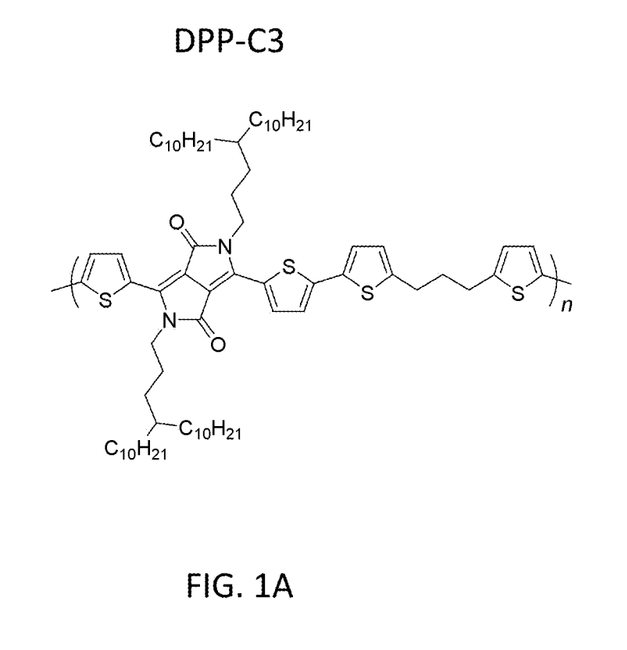
FIGS. 1A and 1B show chemical structures of DPP-C3 and DPP-C0 respectively.
Figure 1B:
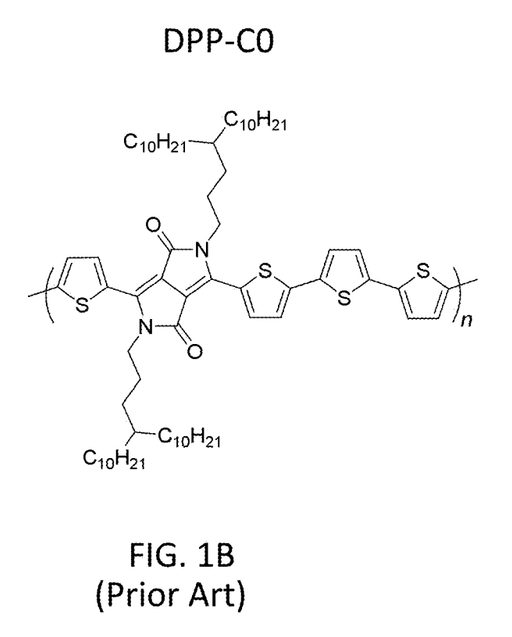

FIGS. 1A and 1B show chemical structures of DPP-C3 and DPP-C0 respectively. The synthesis and characterization of DPP-C3 and DPP-C0 have been previously reported in the publication by Yan Zhao et al, "Conjugation-Break Spacers in Semiconducting Polymers: Impact on Polymer Processability and Charge Transport Properties", Macromolecules, pages 2048-2053 (2015), the contents of which are incorporated by reference in their entirety into this specification. Briefly, DPP-C3 has a flexible, non-conjugated propyl spacer in the repeat unit, while DPP-C0 is a fully-conjugated polymer. DPP-C3 formed highly crystalline 2-D lamellar aggregates in thin films with a step height of 2.2-2.4 nm. The highly crystalline nature of DPP-C3 thin films was also confirmed by grazing incidence x-ray diffraction (GIXRD) measurements. The full-width at half-maximum (FWHM) of both the lamellar and π-π stacking peaks, i.e.

the crystalline coherence length, in spin-coated films is reduced by approximately 25% from DPP-C3 to DPP-C0. The GIXRD measurement also revealed a lamellar spacing of 21.6 Å, in a good agreement with the step height observed in the AFM (Atomic Force Microscope) experiment. In contrast, DPP-C0 has a rigid-rod-like backbone. The strong π-π interaction of conjugation planes drove the crystallization and helped form 1-D nanofibrillar aggregates with large aspect ratios, which is commonly observed in conjugated polymers. The HOMO levels for DPP-C3 and DPP-C0 are −4.97 and −5.13 eV, respectively, while LUMO energy levels are −3.65 and −3.73 eV.

Blends of DPP-C3 and DPP-C0 can be made utilizing by methods known to those skilled in the art and described in the reference "Conjugation-Break Spacers in Semiconducting Polymers: Impact on Polymer Processability and Charge Transport Properties", Macromolecules, pages 2048-2053 (2015), the contents of which are incorporated by reference in their entirety into this specification.

Figure 2:
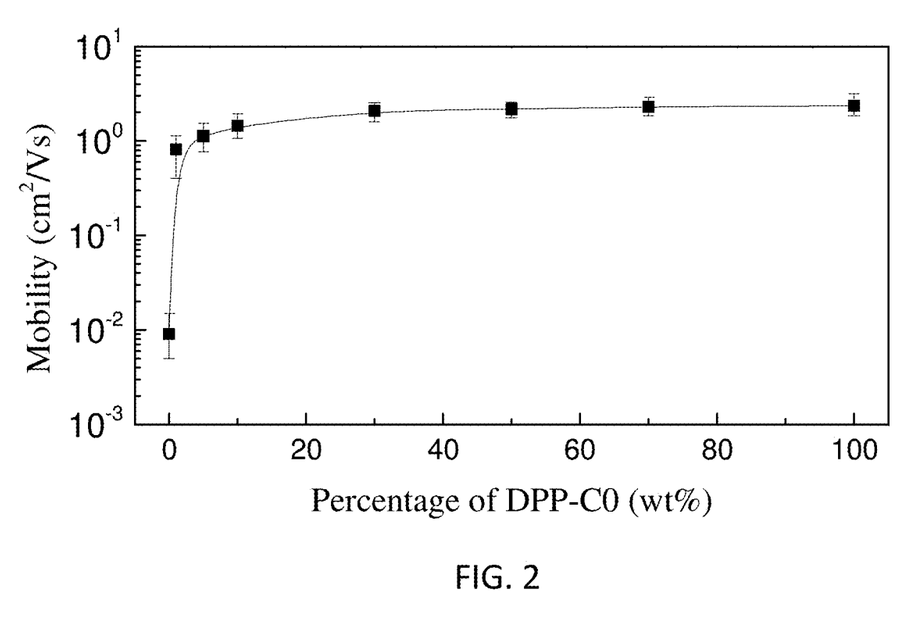
FIG. 2 shows the correlation between the DPP-C3/DPP-C0 blend compositions in the thin films and the charge carrier mobilities of blends measured from bottom-gate bottom-contact field-effect transistors.

The charge transport properties of DPP-C3 and the blends with DPP-C0 were evaluated by the bottom-gate bottom-contact field-effect transistors with silicon as the back gate electrode, a 300 nm thermally oxidized $SiO_2$ layer as the gate dielectric, and pre-patterned gold electrodes as the source/drain. DPP-C3 ($M_n$, ~19.7 kDa) showed an average hole mobility of 0.009 $cm^2 V^{-1} s^{-1}$ and a maximum at 0.015 $cm^2 V^{-1} s^{-1}$, extracted from the saturation regime in transistor transfer curves. These numbers are comparable to those obtained from widely investigated semicrystalline poly(3-hexylthiophene) (P3HT), a reported in literature. Despite the absence of efficient intrachain charge transport pathways, DPP-C3 is still able to provide such an intriguingly high mobility, suggesting that charge transport along π-π stacking directions is efficient in the π-stacks within a crystalline grain. On the other hand, long range connectivity between the crystallites is largely missing in the DPP-C3 thin film due to the lack of conjugated tie chains. Connectivity between crystallites is essential for efficient charge transport, as demonstrated by various molecular weight experiments in the case of P3HT. To restore the connectivity, DPP-C0 ($M_n$, ~30.7 kDa) was blended into DPP-C3 giving rise to 1, 5, 10, 30, 50 and 70 wt % of DPP-C0 in the total blend. The field-effect transistor results are shown in FIG. 2 and summarized in Table 1. FIG. 2 shows the correlation between the DPP-C3/DPP-C0 blend compositions in the thin films and the charge carrier mobilities of blends measured from bottom-gate bottom-contact field-effect transistors. Referring to FIG. 2 and Table 1, upon the addition of 1 wt % of DPP-C0, the mobility of the blend film nearly increased two orders of magnitude from 0.015 to 1.14 $cm^2 V^{-1} s^{-1}$; while it is only doubled from 1.54 to 3.20 $cm^2 V^{-1} s^{-1}$ with the DPP-C0 ratio increased from 5 to 100 wt %. To understand the underlying mechanism for these intriguing and puzzling findings, we have carried out the temperature-dependent FET (Field-Effect Transistor) mobility measurements.

TABLE 1

Charge transport characteristics of DPP-C3 and the DPP-C0/DPP-C3 blends extracted from bottom-gate bottom-contact field effect transistors.

| Amount of DPP-C0 in the Total Blend (wt %) | $\mu_{max}$ ($cm^2 V^{-1} s^{-1}$) | $\mu_{avg}$ | $V_{th}$ (V) | $I_{on}/I_{off}$ |
|---|---|---|---|---|
| 0 | 0.015 | 0.009 | −11.0 ± 2.2 | ~$10^6$ |
| 1 | 1.14 | 0.81 | −9.6 ± 1.8 | $10^7$-$10^8$ |
| 5 | 1.54 | 1.13 | −8.4 ± 1.9 | $10^7$-$10^8$ |

TABLE 1-continued

Charge transport characteristics of DPP-C3 and the DPP-C0/DPP-C3 blends extracted from bottom-gate bottom-contact field effect transistors.

| Amount of DPP-C0 in the Total Blend (wt %) | $\mu_{max}$ ($cm^2 V^{-1} s^{-1}$) | $\mu_{avg}$ | $V_{th}$ (V) | $I_{on}/I_{off}$ |
|---|---|---|---|---|
| 10 | 2.00 | 1.45 | −7.9 ± 0.6 | ~$10^7$ |
| 30 | 2.52 | 2.09 | −6.1 ± 1.1 | ~$10^7$ |
| 50 | 2.57 | 2.18 | −4.9 ± 1.9 | ~$10^7$ |
| 70 | 2.90 | 2.30 | −3.2 ± 2.9 | ~$10^7$ |
| 100 | 3.20 | 2.36 | −2.0 ± 2.4 | $10^6$-$10^7$ |

(In Table 1, μ represents FET mobility; $V_{th}$ represents threshold voltage; $I_{on}/I_{off}$ represents the value of the ratio between device on state current and device off state current.)

Figure 3A:
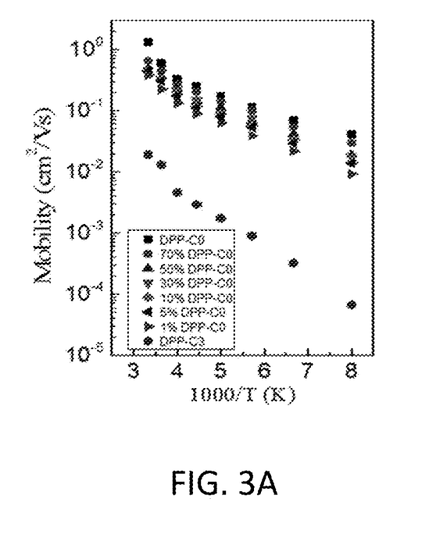
FIG. 3A shows temperature dependent field-effect mobilities for polymer blend OFETs.
Figure 3B:
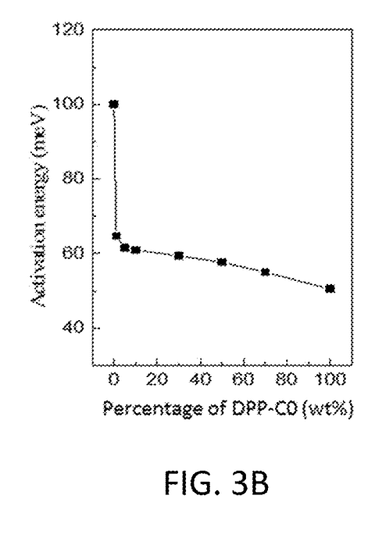
FIG. 3B shows activation energies calculated from FIG. 3A as a function of DPP-C0 ratio in DPP-C0/DPP-C3 blend OFETs.

It is known that charge transport in conjugated polymers is generally an activated process, where the activation energy—related to the polaron binding or self-trapping energy—is a fundamental quantity that is directly related to charge motion both along a single chain and between adjacent chains. To gain a better understanding of how the activation energy varies as a function of blend mole ratio, we performed temperature-dependent FET measurements in vacuum (below 1×$10^{-3}$ pa) in the 125-300 K temperature range. The mobility-temperature curves from representative devices, in this case OFETs are shown in FIG. 3A. Thermally-activated charge transport behavior was observed for all thin films. That is, reduced currents were obtained when the temperature was lowered. At the same time, transistors still retained a high ON/OFF ratio and displayed saturation behavior. Activation energies were calculated from the temperature-mobility curves using the following relation:

$$\mu = \mu_0 e^{-\frac{E_A}{kT}}$$

where k is the Boltzmann constant, T is the thermodynamic temperature, EA is the activation energy, μ is the T-dependent field-effect mobility, and $\mu_0$ is the T-independent mobility prefactor, i.e. the mobility in the limit of high T. The calculated activation energies are plotted versus blend ratio in FIG. 3B. The activation energy of DPP-C3 thin film is around 100.1 meV. It quickly dropped to 64.4 meV upon addition of 1 wt % of DPP-C0. The activation energies continually dropped from 61.5, 60.9, 59.4, 57.6 to 55.0 meV with increasing the DPP-C0 ratio from 5, 10, 30 50 to 70 wt % in the blend films. The value extracted for the pure DPP-C0 thin film is 50.5 meV, in good agreement with reported values on DPP-based polymers. The trend observed in activation energy correlates well with charge transport properties of the blends, suggesting that the improvement in charge mobility is at least partially a result of lowering the activation energy in the polymer blend.

As for as macroscopic thin film morphologies are concerned, two scenarios could occur in the blends. That is, DPP-C0 is distributed in the matrix of DPP-C3 (vice versa), or vertical phase segregation is present between DPP-C0 and DPP-C3 (e.g. DPP-C0 is lying underneath the DPP-C3 layer). Both scenarios could account for the improvement in charge transport and the drop in activation energy of the blends. AFM images of the blend films revealed that the addition of 1 wt % DPP-C0 did not lead to a noticeable change on the surface morphology of DPP-C3. The 1 wt % blend film still exhibited 2-D lamellar feature, consistent with GISAXS (Grazing-Incidence Small-Angle X-ray Scattering) results. With the blending ratio, DPP-C0/(DPP-C0+DPP-C3), increasing from 5, 10, 30, 50 to 70 wt %, a gradual transition from 2-D lamellar morphology to 1-D fibril morphology was observed. The morphological findings suggest that vertical phase segregation is likely absent in the polymer blends.

A depth profile experiment by x-ray photoelectron spectroscopy (XPS) is an ideal tool to determine whether vertical phase segregation is present or not in the polymer blends, as demonstrated in P3HT and polystyrene (or poly(methylmethacrylate), PMMA) blends. Unfortunately, DPP-C3 and DPP-C0 have very similar chemical and elemental compositions. Alternatively, we chose to fabricate a sandwiched diode with the configuration of ITO/PEDOT (30 nm)/polymer film/MoO$_3$ (15 nm)/Ag (150 nm). The assumption is that the space-charge limited current (SCLC) mobility would be limited by the layer of DPP-C3, if the vertical phase segregation is present in the polymer blend. We found out that SCLC mobility is proportional to the ratio of DPP-C0 in the blends. Briefly, The SCLC mobilities are 0.12×10$^{-4}$, 0.74×10$^{-4}$, 4.2×10$^{-4}$ and 26.9×10$^{-4}$ cm$^2$V$^{-1}$s$^{-1}$ for the DPP-C0/DPP-C3 blends with the DPP-C0 ratio of 0, 5, 50 and 100 wt % (the ratio being defined as before). The results strongly suggest no vertical phase segregation is present in the blends.

Figure 4:
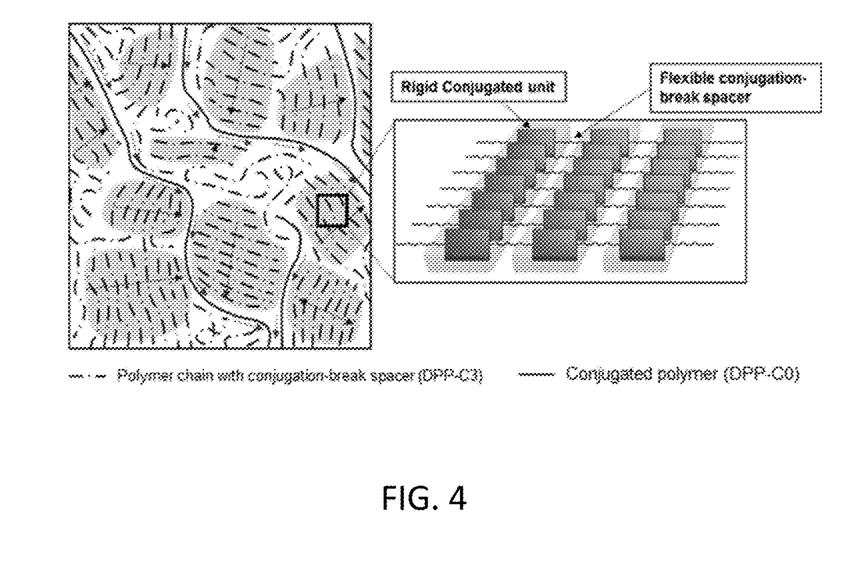
FIG. 4 is a schematic illustration of a complementary binary polymer blend thin film for efficient charge transport.

The totality of structural characterization allows us to conclude that the mobility enhancement at low mole fractions of DPP-C0 is not due to significant changes in the mesoscale microstructure. Combining morphological characterizations and electrical measurements, we conclude that 1) molecular π-stacks are formed in the crystalline aggregates (grains) in DPP-C3, which provides efficient charge transport pathways within a grain along the π-π stacking direction, 2) charge transport between crystalline grains is limited in the DPP-C3 thin films because of the absence of intramolecular charge transport provided by extended π-conjugation, and 3) tie chains (DPP-C0) are responsible for building the connectivity between crystalline aggregates, leading to efficient charge transport in the polymer blend films. The whole mechanistic process is illustrated in FIG. 4.

Figure 5A:
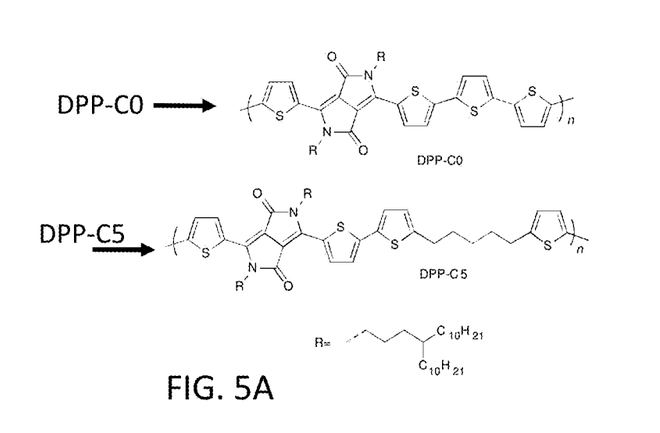
FIG. 5A shows Chemical structure of DPP-C0 and DPP-C5.
Figure 5B:
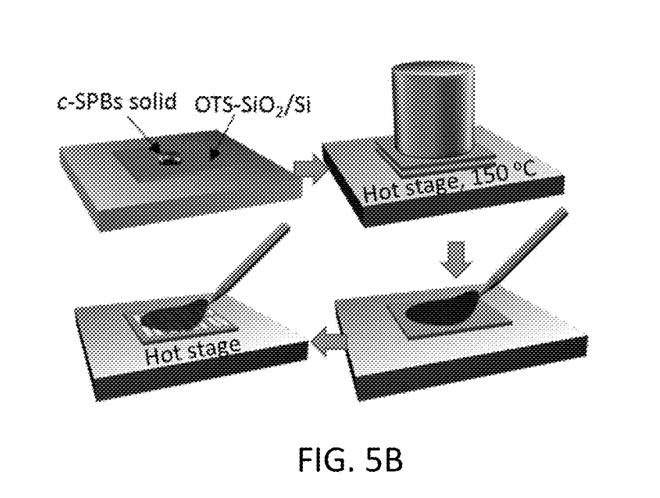
FIG. 5B shows schematic representation of hot press method and the peel-off and transfer approach.
Figure 5C:
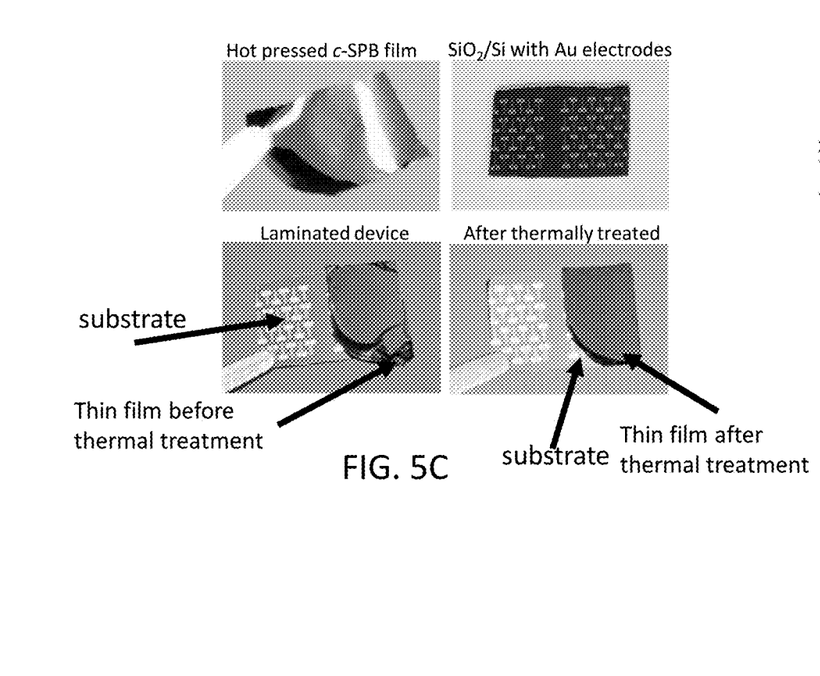
FIG. 5C shows images of hot pressed c-SPB film and the corresponding devices using peel-off and transfer approach.

Experiments have been conducted focusing on fabrication and characterization of melt-processed OFETs. Melt-processed semiconductor films were fabricated by the compressed-melt and peel-off approach well known to those skilled in the art. FIG. 5A shows Chemical structure of DPP-C0 and DPP-C5. The c-SPB solid (5 wt % DPP-C0 and 95 wt % DPP-C5, FIG. 5A) was sandwiched between two OTS-modified SiO$_2$/Si wafers on a hot plate. After heating up to 150° C., the c-SPB solids was pressed (~10 kN cm$^{-2}$) by a heavy object. The thickness of obtained thin films is in the range of 1 to 2 μm, which is mainly controlled by the amount of materials applied, temperature and pressing time. The film was then peeled off, transferred and laminated onto to an OTS-modified SiO$_2$/Si wafers with pre-patterned Au-electrodes, as shown in FIGS. 5B and 5C. Referring to FIG. 5B the process steps are indicated and the sequence of the steps is indicated by arrows. FIG. 5C shows the images of hot-pressed c-SPB film, FET device without semiconductor (labeled as SiO$_2$/Si with Au electrodes), laminated device (laminate comprises thin film and substrate), and the FET device after thermal treatment. It was observed that the obtained freestanding film is smooth and shows metallic luster. The laminated devices were thermally treated to ensure good contact between semiconducting thin films and electrodes/dielectrics before electrical measurements. Referring to FIG. 5C, it can be seen that the thin film of the device is not smooth before the thermal treatment and does not have acceptable contact with the substrate. After thermal treatment, again referring to FIG. 5C, it can be seen that there is good contact between the substrate and the thin film, giving rise to a functional FET device.

Figure 5D:
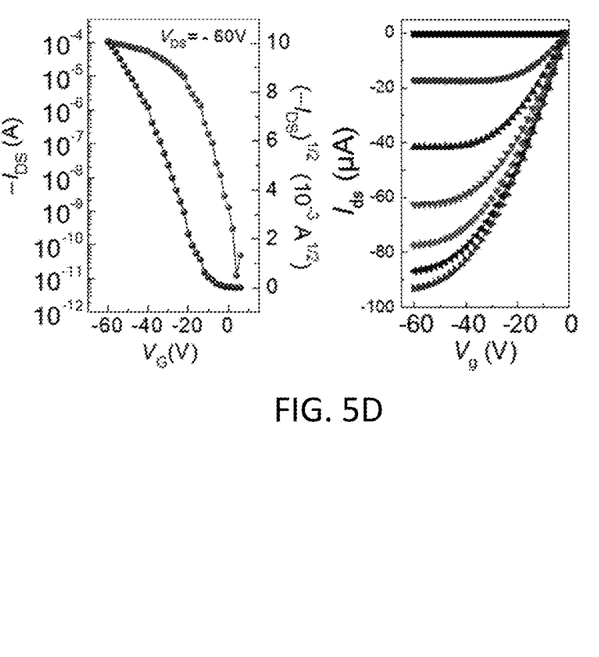
FIG. 5D shows representative transfer and output characteristics of melt processed c-SPB OFETs.

The representative transfer and output curves of the melt-processed OFETs are shown in FIG. 5D. The devices exhibited an average mobility around 0.4 cm$^2$ V$^{-1}$ s$^{-1}$ and current on/off ratio higher than 10$^5$. This result is in par with the spin-coated or drop cast OFETs (0.53 cm$^2$ V$^{-1}$ s$^{-1}$) in the control experiments. Notably, the industrial manufacture of plastic film for products such as shopping bags is usually achieved by melt processing in the same range of temperature. This opens up the possibility for the fabrication of organic electronics through industrially practiced extrusion and lamination process in the future.

Figure 6A:
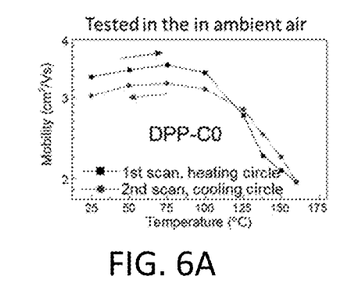
FIGS. 6A, 6B and 6C show temperature dependence of the mobility measured in ambient air for devices using DPP-C0, DPP-C5 and c-SPB as semiconductor, respectively.
Figure 6B:
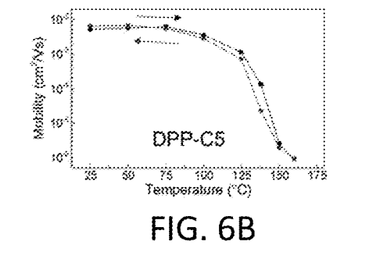
Figure 6C:
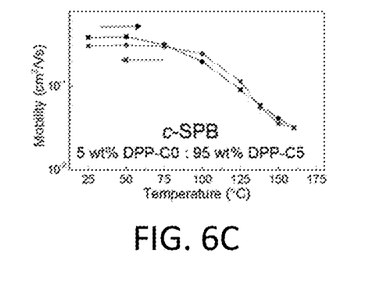
Figure 6D:
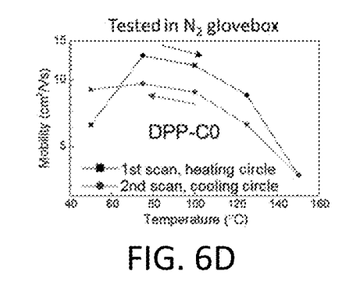
FIGS. 6D and 6E and 6F show temperature dependence of the mobility tested in nitrogen glovebox for devices using DPP-C0, DPP-C5 and c-SPB as semiconductor, respectively.
Figure 6E:
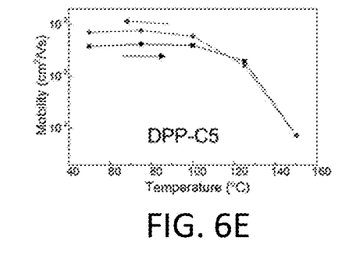
Figure 6F:
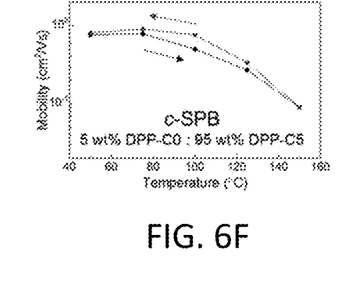

Since the DPP-C5 can be melted at a relatively low temperature, how charge transport will behave at high temperature or even at melting state became one question that continued to intrigue us. To investigate the c-SPB charge transport properties at high temperature, temperature-dependent electrical measurements were carried out both in ambient environment and in nitrogen glove box. A microscope hot stage was used to precisely control the temperature. With the hot stage combined with probe station, the OFETs performance can be tested at different temperatures. The heating and cooling rates were kept around 0.5° C./s. FIGS. 6A, 6B and 6C show temperature dependence of the mobility measured in ambient air for devices using DPP-C0, DPP-C5 and c-SPB as semiconductor, respectively. FIGS. 6D and 6E and 6F show temperature dependence of the mobility tested in nitrogen glovebox for devices using DPP-C0, DPP-C5 and c-SPB as semiconductor, respectively.

Referring to FIGS. 6A and 6D, the following observations can be made: for the heating circle of DPP-C0 OFETs at ambient environment, from room temperature to 75° C., a positive temperature dependence of charge carrier mobility was observed with mobility increased slightly from 3.3 to 3.5 cm$^2$ V$^{-1}$ s$^{-1}$. When temperature was further increased, the temperature coefficient of mobility, dμ/dT, changed sign from positive to negative. The mobility dropped from 3.5 at 75° C. to 2.0 cm$^2$ V$^{-1}$ s$^{-1}$ at 160° C. This trend is reversible when the device was cooled down and the "knee point", where the sign of dμ/dT changed was still around 75° C. The change in sign of dμ/dT at specific temperature could not be foreseen. It was noted that with the presence of water and oxygen in ambient conditions, DPP-C0 OFETs can still perform very well at high temperature up to 160° C. This extended working temperature range for DPP-C0 based OFETs can be useful for some applications that require devices able to operate at high temperatures. For DPP-C0 OFETs, the results we obtained show that the charge carrier transport mode of DPP-C0 OFETs might switched from hopping to band-like at around 75° C. To avoid any influence rising from the presence of water or oxygen in air, and to confirm the reliability of the obtained results, same experiments were carried out inside a nitrogen glovebox and the results are shown in FIG. 6D. Same mobility-temperature trend was observed with the "knee point" still at 75° C. The only difference being the DPP-C0 OFETs performance in glovebox are better with mobility higher than 10 cm$^2$ V$^{-1}$ s$^{-1}$ at 75° C.

Referring to FIGS. 6B and 6E, the following observations can be made: For DPP-C5 OFETs, similar dμ/dT coefficient was obtained (FIG. 6B). However, compared with DPP-C0 OFETs, the mobility decrease is more dramatic, from 0.006 cm² V⁻¹ s⁻¹ at 75° C. to 9.3×10⁻⁷ cm² V⁻¹ s⁻¹ at 160° C. This nearly four orders of magnitude mobility decrease can also be reversed with the OFET performance fully coming back to its original state upon cooling. For the measurement carried out inside glove box (FIG. 6E), the trend when temperature was kept below 120° C. is almost the same with that in ambient environment. However, inside the glove box, the mobility at 150° C. is about two orders of magnitude higher than in ambient air. Since all other conditions are the same, this performance difference must be caused by the water or oxygen in air. One reasonable explanation is that at room temperature, the molecules of DPP-C5 packed very well and the well-ordered molecular packing inhibits the ingress of water or oxygen. When temperature getting close to the melting point, the well-ordered molecular packing was interrupted and the films are hence looser and more sensitive, resulting in lower performance in ambient air.

Referring to FIGS. 6C and 6F, the following observations can be made: For the c-SPB system with 5 wt % of DPP-C0 and 95 wt % of DPP-C5, a similar trend with DPP-C0 and DPP-C5 was observed with the "knee point" at around 50° C. In ambient air, the mobility dropped from 0.4 cm² V⁻¹ s⁻¹ at 50° C. to 0.03 cm² V⁻¹ s⁻¹ at 160° C. Compared with DPP-C5 OFET, this smaller mobility decrease shows that the tie chain polymer, DPP-C0, plays a very important role in the c-SPB system. By combining high OFET performance property of DPP-C0 and low melting point property of DPP-C5, high performance and healable polymer semiconductor might then be achieved in a c-SPB blend.

It should be noted that the OFET performance can be observed even when the temperature is higher than the melting point of DPP-C5 (138° C.). This result shows that charge carrier can transport in liquid phase semiconductor. In addition, when DPP-C5 film is fully melted, the material becomes liquid and can be reshaped. If there are cracks or notches in the film, the cracks or notches can then be "healed". Since the OFET performance can be fully recovered from the melt state, this "melt-heal-cool down" approach can be used to heal OFET devices that using low melting point semiconductors. In the past, scientists have used different mechanisms to design healable materials. Most of them introduce new function groups or healing agent. These new introduced groups or materials may behave as impurities, traps or change the molecular packing, resulting in decreased performance or even kill the OFETs. Therefore, healable organic semiconductor is still a big challenge. This disclosure provides a new way to design healable organic semiconducting material.

Temperature-dependent grazing incidence X-ray diffraction (GIXRD) was carried out to investigate how molecular packing changed at various temperatures and how it influences the OFETs performance. The GIXRD measurements were carried out starting from 25° C. to 160° C., and then cooling the sample back down to 25° C. Before GIXRD measurements, all thin films were annealed at 120° C. in the glovebox. 1-dimension (1D) GIXRD curves are presented in FIGS. 7A through 7C. At 25° C., all three materials show clear edge-on molecular packing mode with π-π stacking (0k0) peaks appearing in the in-plane direction and lamellar packing (h00) peaks in the out-of-plane direction. The lamellar packing distances are 23.53 Å, 23.30 Å and 23.34 Å for DPP-C0, DPP-C5 and c-SPB respectively. For π-π stacking, the distances are 3.69 Å, 3.70 Å and 3.72 Å respectively for DPP-C0, DPP-C5 and c-SPB.

Figure 7A:
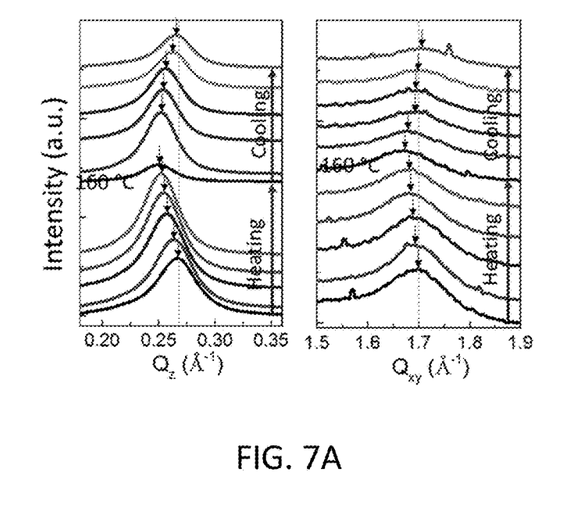
FIGS. 7A through 7C show 1-dimension (1D) GIXRD curves for DPP-C0, DPP-C5 and c-SPB thin films, respectively.

Referring to FIG. 7A, the following observations can be made: For DPP-C0 films, the GIXRD results clearly show that the lamellar packing peaks moved to smaller Q vector direction and the calculated packing distance is from 23.53 Å at 25° C. to 25.13 Å at 160° C. In addition, the peaks became weaker when temperature increased. When cooled down, the lamellar packing distance can be fully recovered to around 23.60 Å at 25° C. For π-π stacking peaks, the same trend was observed with π-π stacking distance increased from 3.69 Å at 25° C. to 3.74 Å at 160° C. The π-π stacking distance is even a little closer to 3.68 Å when temperature gets back to 25° C. From DPP-C0 GIXRD results, two important points can be concluded: first, for DPP-C0 films, when temperature increased from 25° C. to 160° C., both lamellar packing and π-π stacking distances increased, and these packing distance changes are reversible when cooled down. Second, although the peaks at 160° C. are not as sharp as those at 25° C., clear (010) peak and sharp (h00) peak can still be observed, which indicates that the crystallinity of DPP-C0 film is still intact even at high temperatures up to 160° C.

Figure 7B:
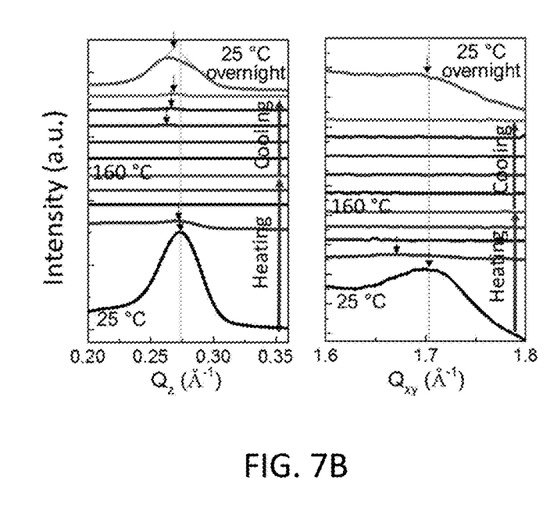

Referring to FIG. 7B, the following observations can be made: When temperature increased, the GIXRD peaks of DPP-C5 film degraded significantly. At 50° C., the π-π stacking peaks is almost absent, and lamellar packing peak reduced from a sharp (100) peak to a very weak peak. When temperature further increased to 120° C., the lamellar packing peak is too weak to observe. No GIXRD signal can be observed when temperature is higher than 120° C. These results show clearly that the well-ordered molecular packing is already disrupted even when temperature is 50° C. lower than the melting point. For the cooling circle, when temperature went back to 120° C., the GIXRD pattern showed a weak (100) peak similar to the heating circle. When temperature went further down, the sharp peaks like before heating did not come back. After left the sample at room temperature overnight, all the sharp peaks came back as shown in FIG. 7B.

Figure 7C:
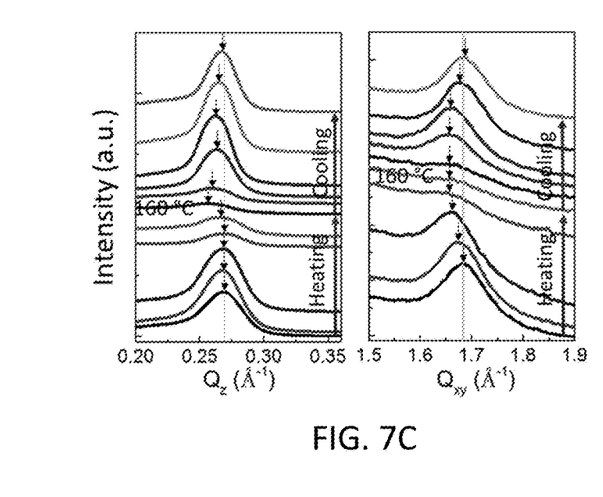

Referring to FIG. 7C, the following observations can be made: GIXRD of c-SPB thin film show similar packing distances and temperature-dependent trend with DPP-C0. Compared with DPP-C5, what's astonishing is that with 95 wt % of DPP-C5, the c-SPB film can still show clear fourth order lamellar packing peak at 160° C. Although both lamellar packing and π-π stacking peaks showed degradation when temperature reached 138° C. or higher, the well-shaped π-π stacking and lamellar packing peaks provide strong evidence that the c-SPB film can keep high crystallinity even when temperature is higher than the melting point. 5 wt % of DPP-C0 strongly increases the ability of c-SPB film to maintain its crystallinity at high temperature or even at temperature higher than the melting point. In addition, unlike DPP-C0 film, the lamellar packing distance of c-SPB film stays unchanged at 23.34 Å when temperature increased from 25° C. to 120° C. When temperature further increased to 160° C., sharp changes in the lamellar packing distance occurred from 23.34 Å at 120° C. to 24.59 Å at 160° C. This is another piece of evidence that showed the enhanced ability of c-SPB material to keep high crystallinity at high temperature. For π-π stacking, the trend of c-SPB GIXRD results is similar with DPP-C0 with π-π stacking distance increased gradually from 3.73 Å at 25° C. to 3.79 Å at 160° C. Both lamellar packing and π-π stacking distance can be recovered after the film was cooled down to 25° C.

The GIXRD results agree very well with the temperature-dependent OFETs results. For all the polymer OFETs, the increased or disrupted molecular packing is a conclusive reason for the decrease in mobility.

Figure 8A:
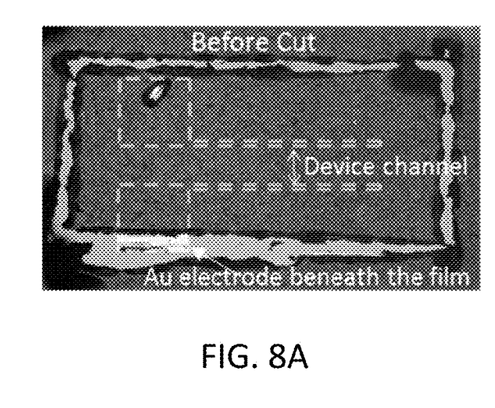
FIGS. 8A through 8D show optical images of healable c-SPB semiconducting polymer.
Figure 8B:
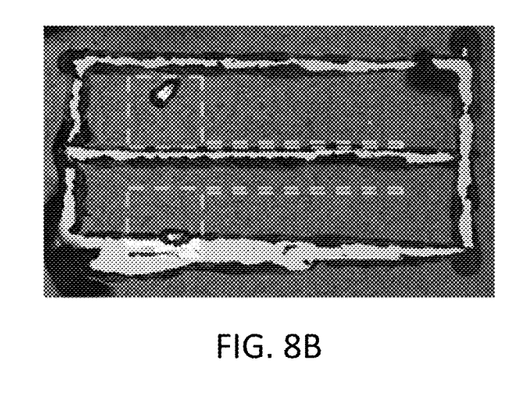
Figure 8C:
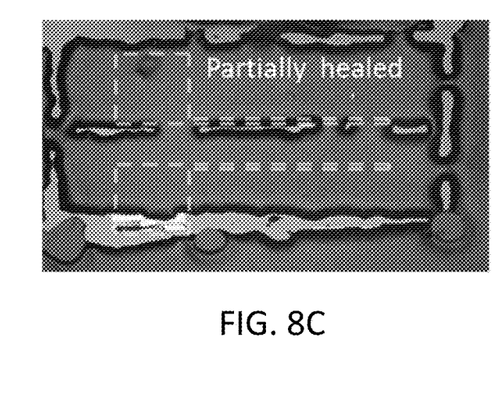
Figure 8D:
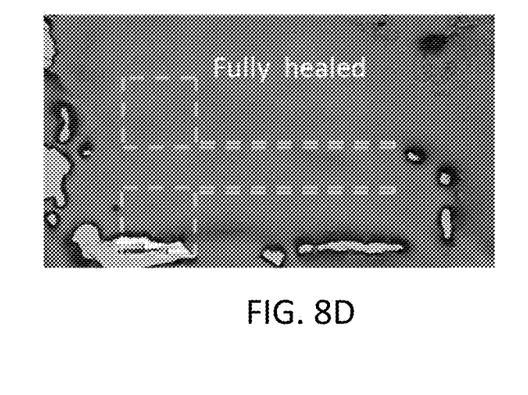
Figure 9:
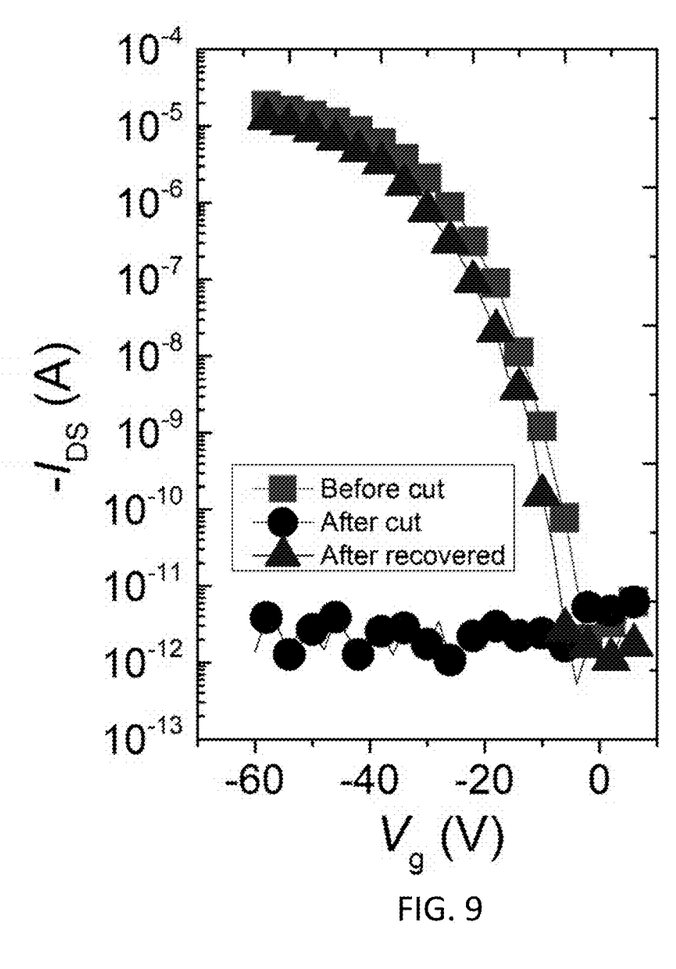
FIG. 9 shows electrical characterization of c-SPB device before cut, after cut and after healed.

Self-healing is a phenomenon found in living systems and is crucial for their survival from various structural damages. Inspired by nature, prolific research has been carried out on artificial self-healing materials that can repair the damages and restore their mechanical performance. With this characteristic, the lifetime of products can be expanded. Furthermore, it is also an important property to help realize biomimetic products like e-skins. For organic electronics and biomimetic electronics, electrically self-healing materials along with restoring their mechanical properties are demanded. With both high performance and low melting point, c-SPB material is a great candidate for healable semiconducting polymer. Healable property of c-SPB (DPP-C5 and DPP-C0) material was investigated with a melt-processed OFET device. FIGS. 8A through 8D show optical images of healable c-SPB semiconducting polymer. Prior to healable experiment, the device was isolated by scratching a circle around it to avoid any current leakage (FIG. 8A). The device was tested and showed a mobility of 0.29 cm$^2$ V$^{-1}$ s$^{-1}$. A notch was generated in the channel area between source and drain electrodes of the device using probe tip (FIG. 8B). FIG. 9 shows electrical characterization of c-SPB device before cut, after cut and after healed. FIG. 9 shows that the device was completely destroyed with source-drain current constantly in ~10$^{-12}$ A level, which is the off current level of the device. This means the device channel was fully separated into two parts. After heating the film at 160° C. for 2 minutes, the film was partially healed as shown in FIG. 8C. However, with longer heating time or higher heating temperature, the film cannot be self-healed. A small piece of OTS modified SiO$_2$/Si wafer was placed on top of the melt c-SPB film and pushed slightly to help the healing of the device. FIG. 8D shows picture of the resulting film and the channel area is fully healed. OFET measurements showed the recovered performance with mobility back to 0.2 cm$^2$ V$^{-1}$ s$^{-1}$, as shown in FIG. 9. The results obtained above clearly demonstrated the healable property of c-SPB material.

The use of c-SPB offers an opportunity to lift intrinsic and general trade-offs in semicrystalline polymers. High molecular weight polymers are typically desired for charge transport. Because long chains build electrical connectivity between crystalline grains and allow efficient charge transport across crystalline boundaries. On the other hand, long chains are often associated with higher structural (paracrystalline) disorder in the π-stacking directions, leading to the formation of charge carrier traps. Hence, charge transport is limited by paracrystalline disorder once connectivity between crystalline aggregates is sufficiently present. In the present disclosure, it is demonstrated that a binary polymer blend could present both high crystallinity and necessary connectivity for efficient charge transport, where only a small percentage of conjugated tie-chain polymer (DPP-C0) is blended into a highly crystalline polymer matrix (DPP-C3). We envision that such a complementary binary polymer blend could ultimately provide better charge transport characteristics than either of the individual component with careful design of polymer pairs and optimization of blend morphology.

A major benefit for use of c-SPB system is the enhanced solution-processability. Due to the presence of flexible conjugation-break spacers along the polymer backbone, DPP-C3 is highly soluble in common organic solvents (e.g., toluene, chlorobenzene and chloroform). For instance, it has a solubility over 50 mg/ml in dichlorobenzene. In contrast, the solubility of DPP-C0 is about 3 mg/ml. In the blend system, only small amount of fully conjugated polymer is required to build the connectivity. Therefore, solubility is no longer a problem during materials processing and device fabrication.

It should be recognized that in this disclosure c-SPB have been designed to elucidate the role of polymer tie chains on efficient charge transport in polymeric thin films. Furthermore, the findings of this disclosure indicate that c-SPB systems can be a new platform to achieve high mobility electronic materials with enhanced solution-processability for future organic electronics.

Charge transport in polymeric thin films is a complicated process, which involves a multitude of coupled electronic events. Due to the growing appeal of semiconducting polymers in organic electronics, it makes the fundamental understanding of charge transport increasingly important. Thus in this disclosure, a two-step approach is proposed to reveal the nature of the connections between crystalline aggregates in polymer thin films. The first step involves the study of a semiconducting polymer with intentionally placed conjugation-break spacers along the polymer backbone. The second step brings in a fully conjugated polymer that is blended into the non-conjugated polymer matrix as tie chains to bridge crystalline aggregates. The results show that the addition of as low as 1 wt % of the conjugated polymer induces nearly two orders of magnitude improvement in charge carrier mobility from ~0.015 to 1.14 cm$^2$ V$^{-1}$ s$^{-1}$, accompanied by substantial lowering of activation energies from 100.1 meV to 64.6 meV. The larger the percentage of tie chains, the higher the mobility in the blend. These findings illustrate the role of conjugated tie chains for efficient charge transport and also enable a new design principle to take advantage of complementary binary polymer blends to obtain high mobility electronic materials with enhanced solution-processability for future organic electronics.

In this disclosure, a strategy to render semiconducting polymers melt-processable, yet ensuring that their thin films present a stable morphology and electronic performance was demonstrated using DPP-C5 as a matrix polymer, together with DPP-C0 as a tie chain polymer. The melt processed devices exhibited an average mobility around 0.4 cm$^2$V$^{-1}$s$^{-1}$ and current on/off ratio higher than 10$^5$. Grazing temperature-dependent incidence X-ray diffraction (GIXRD) and charge transport measurements provide the evidence that the c-SPB has a reversible morphology and device performance. Based on the reversible feature of melting process, thermally healable OFETs were demonstrated.

According to this disclosure, a method of making a solid state semiconducting films is described. The method includes providing a non-conjugated semiconducting polymer matrix containing crystalline aggregates with intentionally placed conjugation-break spacers along the polymer backbone, a fully conjugated semiconducting polymer, and blending the fully conjugated semiconducting polymer into the non-conjugated semiconducting polymer matrix, resulting in a semiconducting polymer blend, wherein the fully conjugated polymer serves as tie chains to bridge crystalline aggregates of the non-conjugated polymer matrix. The semiconductor polymer blend is then subjected to a film-making method based on solution processing or melt-processing to form a semiconducting film.

In another embodiment of the method, the fully conjugated semiconducting polymer contains isolated polymer chains. In yet another embodiment of the method, the fully conjugated semiconducting polymer contains crystalline aggregates. In another embodiment of the method, the fully conjugated semiconducting polymer contains both isolated polymer chains and crystalline aggregates. In one embodiment of the method, the weight percent of the fully conjugated semiconducting polymer is in the range of 1.0 to 90.0 percent of the total blend containing the fully conjugated semiconducting polymer and the non-conjugated semiconductor polymer matrix. In one embodiment of the method, the non-conjugated polymer semiconductor is DPP-C3 and the fully conjugated polymer semiconductor is DPP-C0. When DPP-C0 and DPP-C3 are used, the DPP-C0 is in the range of 1.0-90.0 weight percent of the total blend containing DPP-C3 and DPP-C0. In another embodiment of the method, the non-conjugated polymer semiconductor is DPP-C5 and the fully conjugated polymer semiconductor is DPP-C0. When DPP-C0 and DPP-C5 are used, the DPP-C0 is in the range of 1.0-90.0 weight percent of the total blend containing DPP-C5 and DPP-C0.

It should be recognized that in the method described above, the non-conjugated semiconductor polymer matrix containing crystalline aggregates can include more than one chemical structure for the matrix. As a non-limiting example, the matrix can include both DPP-C3 and DPP-C5.

It is an object of this disclosure to describe a solid state semiconducting film which includes a non-conjugated semiconducting polymer matrix containing crystalline aggregates with intentionally placed conjugation-break spacers along the polymer backbone, and a fully conjugated semiconducting polymer, wherein the fully conjugated semiconducting serves as tie chains to bridge crystalline aggregates from the non-conjugated polymer matrix. In this solid state semiconducting film the weight percent of the fully conjugated semiconducting polymer is in the range of 1.0 to 90.0 percent of the total blend containing the fully conjugated semiconducting polymer and the non-conjugated semiconductor polymer matrix. Further, in this solid state semiconducting film the non-conjugated polymer semiconductor is DPP-C3 and the fully conjugated polymer semiconductor is DPP-C0. Based on the studies detailed in the description above, a solid state semiconducting film can also be made such that the non-conjugated polymer semiconductor is DPP-C5 and the fully conjugated polymer semiconductor is DPP-C0. Again, similar to the case of DPP-C3 and DPP-C0, the weight percent of the fully conjugated semiconducting polymer is in the range of 1.0 to 90.0 percent of the total blend containing the fully conjugated semiconducting polymer and the non-conjugated semiconductor polymer matrix.

It should be recognized that in the solid state semiconducting film described above, the non-conjugated semiconductor polymer matrix containing crystalline aggregates can include more than one chemical structure for the matrix. As a non-limiting example, the matrix can include both DPP-C3 and DPP-C5.

It is an object of this disclosure to describe sensors and devices that employ a semiconducting film of this disclosure, wherein the film includes a non-conjugated semiconducting polymer matrix containing crystalline aggregates with intentionally placed conjugation-break spacers along the polymer backbone; and a fully conjugated semiconducting polymer, wherein the fully conjugated semiconducting polymer serves as tie chains to bridge crystalline aggregates from the non-conjugated polymer matrix. Such devices include, but are not limited to, optoelectronic devices, and sensors for different applications. Non-limiting examples of applications of sensors made from the semiconducting films of this disclosure include chemical and biological applications.

While the present disclosure has been described with reference to certain embodiments, it will be apparent to those of ordinary skill in the art that other embodiments and implementations are possible that are within the scope of the present disclosure without departing from the spirit and scope of the present disclosure.

The invention claimed is:

1. A device comprising:
a solid state semiconducting film which includes a non-conjugated semiconducting polymer matrix containing crystalline aggregates with intentionally placed conjugation-break spacers along the polymer backbone; and
a fully conjugated semiconducting polymer, wherein the fully conjugated semiconducting polymer serves as tie chains to bridge crystalline aggregates from the non-conjugated polymer matrix, wherein the weight percent of the fully conjugated semiconducting polymer is in the range of 1.0 to 90.0 weight percent of blend of the fully conjugated semiconducting polymer and the non-conjugated semiconductor polymer matrix,
wherein the non-conjugated polymer semiconductor is DPP-C3 or DPP-05, and the fully conjugated polymer semiconductor is DPP-C0.

2. The device of claim 1, wherein the non-conjugated semiconducting polymer matrix containing crystalline aggregates comprises DPP-C3 and DPP-05, and the fully conjugated semiconducting polymer is DPP-C0.

3. An optoelectronic device comprising: a solid state semiconducting film which includes a non-conjugated semiconducting polymer matrix containing crystalline aggregates with intentionally placed conjugation-break spacers along the polymer backbone and a fully conjugated semiconducting polymer;
wherein the fully conjugated semiconducting polymer serves as tie chains to bridge crystalline aggregates from the non-conjugated polymer matrix, wherein the weight percent of the fully conjugated semiconducting polymer is in the range of 1.0 to 90.0 weight percent of blend of the fully conjugated semiconducting polymer and the non-conjugated semiconductor polymer matrix;
wherein the non-conjugated polymer semiconductor is DPP-C3 or DPP-05, and the fully conjugated polymer semiconductor is DPP-C0.

4. A sensor comprising: a solid state semiconducting film which includes a non-conjugated semiconducting polymer matrix containing crystalline aggregates with intentionally placed conjugation-break spacers along the polymer backbone and a fully conjugated semiconducting polymer; wherein the fully conjugated semiconducting polymer serves as tie chains to bridge crystalline aggregates from the non-conjugated polymer matrix;
wherein the weight percent of the fully conjugated semiconducting polymer is in the range of 1.0 to 90.0 weight percent of blend of the fully conjugated semiconducting polymer and the non-conjugated semiconductor polymer matrix;
wherein the non-conjugated polymer semiconductor is DPP-C3 or DPP-05, and the fully conjugated polymer semiconductor is DPP-C0; and
wherein the sensor is capable of sensing a chemical parameter or a biological parameter.

* * * * *